United States Patent
Aude

(10) Patent No.: US 6,982,599 B1
(45) Date of Patent: Jan. 3, 2006

(54) MULTISTAGE DIFFERENTIAL AMPLIFIER WITH COMMONLY CONTROLLED INPUT AND OUTPUT COMMON MODE VOLTAGES

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 68 days.

(21) Appl. No.: 10/771,961

(22) Filed: Feb. 4, 2004

(51) Int. Cl.
*H03F 3/45* (2006.01)

(52) U.S. Cl. .................. 330/258; 330/133; 330/310
(58) Field of Classification Search ........ 330/253–254, 330/258–259, 261, 133
See application file for complete search history.

(56) References Cited

U.S. PATENT DOCUMENTS

| | | | |
|---|---|---|---|
| 4,918,399 A * | 4/1990 | Devecchi et al. ........... 330/253 |
| 5,287,071 A * | 2/1994 | Olmstead et al. ........... 330/258 |
| 5,933,056 A * | 8/1999 | Rothenberg ................. 330/258 |
| 6,331,803 B1 * | 12/2001 | Zheng et al. ............... 330/254 |
| 6,445,250 B1 | 9/2002 | Aude |
| 6,577,185 B1 * | 6/2003 | Chandler et al. ............. 330/9 |
| 6,580,324 B2 * | 6/2003 | Palaskas et al. ............ 330/258 |
| 6,703,898 B2 * | 3/2004 | Renous ...................... 330/253 |

* cited by examiner

*Primary Examiner*—Peguy JeanPierre
*Assistant Examiner*—Khai M Nguyen
(74) *Attorney, Agent, or Firm*—Vedder Price Kaufman & Kammholz, P.C.

(57) ABSTRACT

A multistage differential amplifier with commonly controlled input and output common mode voltages. A shared common mode control signal jointly controls both input and output common mode voltages with a DC gain and bandwidth substantially equivalent to the differential signal gain and bandwidth.

18 Claims, 4 Drawing Sheets

MULTISTAGE DIFFERENTIAL AMPLIFIER WITH COMMONLY CONTROLLED INPUT AND OUTPUT COMMON MODE VOLTAGES

BACKGROUND OF THE INVENTION

1. Field of the Invention

The present invention relates to differential amplifiers, and in particular, to differential amplifiers with a controllable common mode voltage.

2. Description of the Related Art

Signal amplifiers are used in many applications and may include amplifiers used for buffering or otherwise amplifying AC signals, as well as buffering or otherwise amplifying DC signals. One particular example of amplifiers used for DC signals includes those amplifiers used for generating reference voltages. Such reference voltage amplifiers are sometimes required to drive large circuit capacitances, such as those found in many analog signal systems. With such highly capacitive loads, it is difficult to achieve high DC gain and high bandwidth in an efficient manner. One common technique to address this problem is to use a differential amplifier. However, differential amplifiers require that both the input and output common mode voltages be controlled.

One widely used common mode control involves the placement of a voltage divider at the output of the amplifier. However, this reduces the DC gain of the amplifier, thereby requiring the use of a multistage amplifier to compensate for such gain reduction.

Another technique is the use of a multistage, or cascaded, transconductance (gm/gm) amplifier. However, a cascaded transconductance amplifier will still have low DC gain and poor phase margin since the amplifier must be internally compensated. In an effort to maintain DC gain by avoiding the use of a resistive output voltage divider, one technique involves a simple gate-averaging amplifier at the output to sense the output voltage and then apply a feedback voltage to correct the output common mode voltage. However, only the output amplifier stage benefits from this, leaving the auxiliary, or preceding, amplifier stage(s) with no common mode voltage control. As a result, the common mode voltage loop will have low DC gain and low bandwidth.

SUMMARY OF THE INVENTION

In accordance with the presently claimed invention, a multistage differential amplifier is provided with commonly controlled input and output common mode voltages. A shared common mode control signal jointly controls both input and output common mode voltages with a DC gain and bandwidth substantially equivalent to the differential signal gain and bandwidth.

In accordance with one embodiment of the presently claimed invention, a multistage differential amplifier with commonly controlled input and output common made voltages includes differential input terminals, differential output terminals, a common mode control terminal, and differential amplifier circuits. First and second differential input terminals convey first and second phases of a differential input signal with an associated input common mode voltage. First and second differential output terminals convey first and second phases of a differential output signal corresponding to the differential input signal with an associated output common mode voltage. A common mode control terminal conveys a common mode control signal for jointly controlling the input and output common mode voltages. A plurality of differential amplifier circuits are successively coupled between the common mode control terminal, the first and second differential input terminals, and the first and second differential output terminals. Each one of the plurality of differential amplifier circuits includes first and second amplifier input terminals, first and second amplifier output terminals, an input control terminal and an output control terminal. A first one of the plurality of differential amplifier circuits is coupled to the first and second differential input terminals via the first and second amplifier input terminals, and is further coupled to the common mode control terminal via the input control terminal. A last one of the plurality of differential amplifier circuits is coupled to the first and second differential output terminals via the first and second amplifier output terminals. The first and second amplifier input terminals and the input control terminal of each succeeding one of the plurality of differential amplifier circuits is coupled to the first and second amplifier output terminals and the output control terminal, respectively, of a preceding one of the plurality of differential amplifier circuits.

In accordance with another embodiment of the presently claimed invention, a multistage differential amplifier with commonly controlled input and output common mode voltages includes input differential amplifier circuitry, intermediate differential amplifier circuitry and output differential amplifier circuitry. The input differential amplifier circuitry includes: first and second input amplifier input terminals for reception of first and second phases of a differential input signal with an associated input common mode voltage; first and second input amplifier output terminals; an input amplifier control input terminal for reception of a common mode control signal; and an input amplifier control output terminal. The intermediate differential amplifier circuitry includes: first and second intermediate amplifier input terminals coupled to the first and second input amplifier output terminals; first and second intermediate amplifier output terminals; an intermediate amplifier control input terminal coupled to the input amplifier control output terminal; and an intermediate amplifier control output terminal. The output differential amplifier circuitry includes: first and second output amplifier input terminals coupled to the first and second intermediate amplifier output terminals; first and second output amplifier output terminals for conveyance of first and second phases of a differential output signal corresponding to the differential input signal with an associated output common mode voltage corresponding to the input common mode voltage; an output amplifier control input terminal coupled to the intermediate amplifier control output terminal; and an output amplifier control output terminal.

In accordance with still another embodiment of the presently claimed invention, a multistage differential amplifier with commonly controlled input and output common mode voltages includes input amplifier means, intermediate amplifier means and output amplifier means. The input amplifier means is for receiving a common mode control signal and an input differential signal with an associated input common mode voltage and in response thereto providing a first intermediate differential signal and a first intermediate control signal, wherein the input common mode voltage is controlled by the common mode control signal. The intermediate amplifier means is for receiving the first intermediate differential signal and the first intermediate control signal and in response thereto providing a second intermediate differential signal and a second intermediate control signal. The output amplifier means is for receiving the second intermediate differential signal and the second intermediate control signal and in response thereto providing an output differential signal corresponding to the input differential signal with an associated output common mode voltage corresponding to the input common mode voltage.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1A:
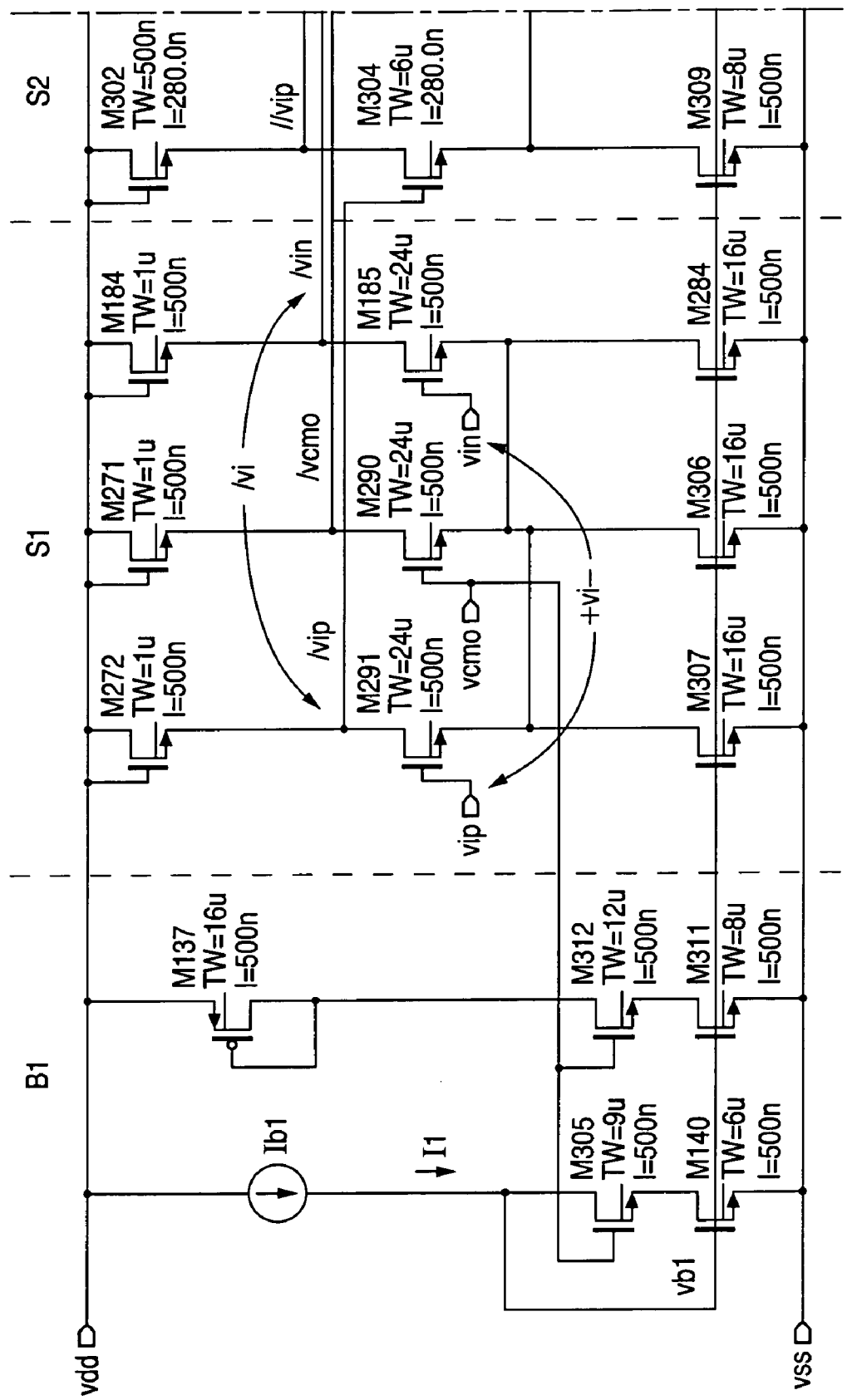
FIGS. 1A and 1B together are a schematic circuit diagram of a multistage differential amplifier with commonly controlled input and output common mode voltages in accordance with one embodiment of the presently claimed invention.
Figure 1B:
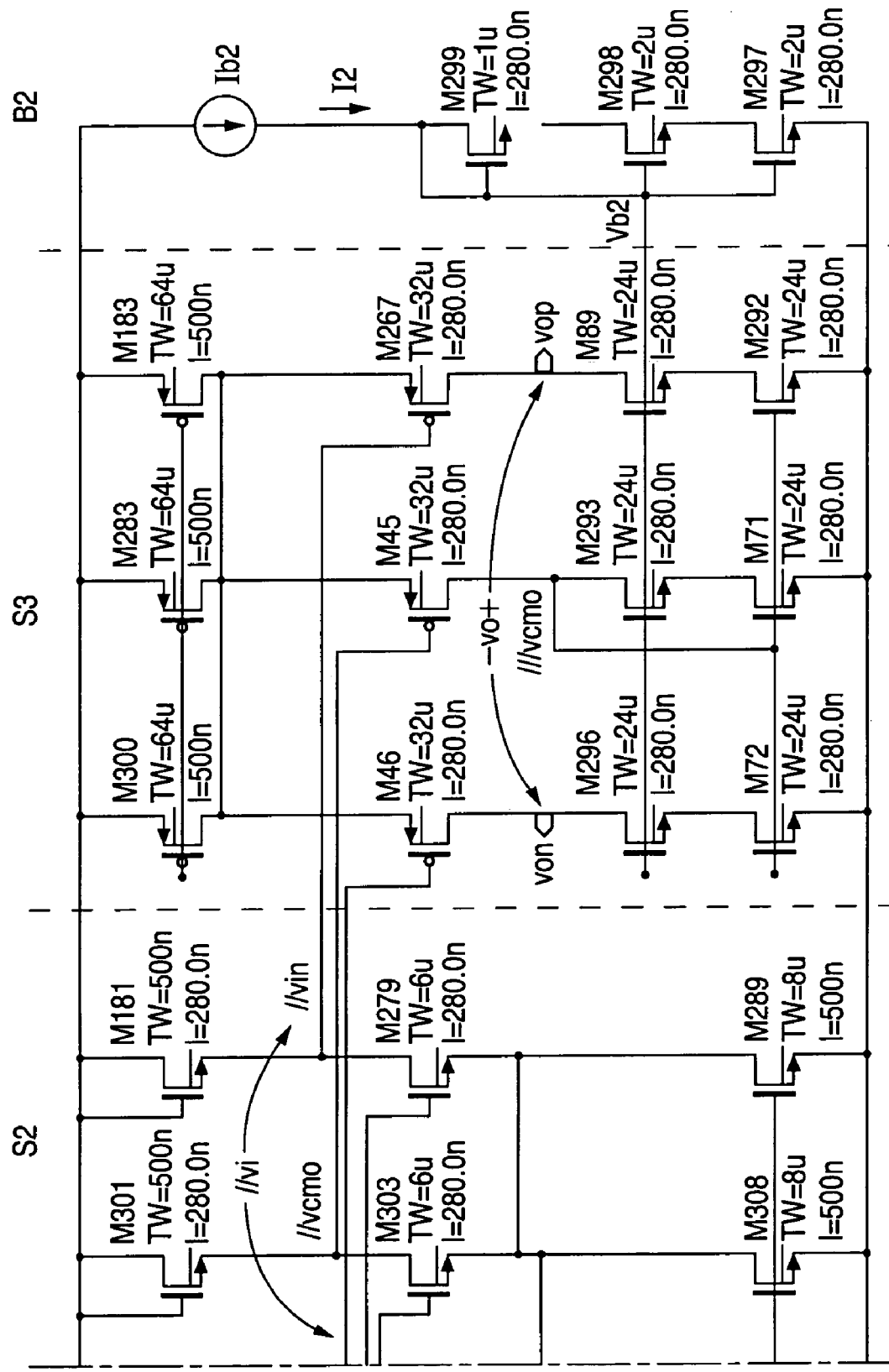

Referring to FIGS. 1A and 1B together, a multistage differential amplifier with commonly controlled input and output common mode voltages in accordance with one embodiment of the presently claimed invention includes three amplifier stages S1, S2, S3 and two biasing stages B1, B2 biased between the power supply rails VDD, VSS. Input stage S1 and intermediate stage S2 are formed by three circuit branches having multiple telescopically coupled N-type metal oxide semiconductor field effect transistors (N-MOSFETS). Output stage S3 has three circuit branches made up of multiple complementary MOSFETs (C-MOSFETs). For example, transistor M272 in the first stage S1 is an N-MOSFET and transistor M300 in the output stage S3 is a P-MOSFET.

The input biasing stage B1 includes a current source IB1 which provides a current I1 to transistors M305 and M140. This causes a bias voltage VB1 to be generated at the gate terminals of transistors M140, M311, M307, M306, M284, M309, M308 and M289 of the input bias stage B1, input amplifier stage S1 and intermediate amplifier stage S2. Similarly, output biasing stage B2 includes a current source 1132 which provides a current 12 to transistors M299, M298 and M297. This causes a biasing voltage VB2 to be generated at the gate terminals of these transistors, as well as to the gate terminals of transistors M296, M293 and M89 of the output amplifier stage S3.

The input amplifier stage S1 receives the positive VIP and negative VIN signal phases of the differential input signal VI at the gate terminals of transistors M291 and M185. The common mode control voltage VCMO is applied to the gate terminal of transistor M290 of the input amplifier stage S1 and to the gate terminals of transistors M305 and M312 of the input biasing stage B1.

In response to the application of the input differential signal phases VIP, VIN, the first amplifier stage S1 generates corresponding inverted signals /VIP and /VIN at the drain terminals of transistors M291 and M185, respectively. Similarly, application of the common mode voltage control signal VCMO causes a corresponding inverted control signal /VCMO to be generated at the drain terminal of transistor M290. These signals /VIP, /VIN, /VCMO drive the drain terminals of corresponding transistors in the second amplifier stage S2. This, in turn, results in further corresponding signals //VIP, //VIN, //VCMO to be generated at the drain terminals of transistors M304, M279 and M303. These signals //VIP, WEN, //VCMO drive the gate terminals of corresponding transistors M46, M267 and M45 in the output amplifier stage S3, thereby generating the negative VON and positive VOP signal phases of the output signal VO, and a corresponding common mode control voltage ///VCMO at the drain terminals of transistors M46, M267 and M45, respectively. As a result, it can be seen that the common mode control signal VCMO applied at the input amplifier stage S1 propagates through each amplifier stage S1 S2, S3 so as to control the common mode voltages for the input signal VI and the output signal VO, as well as for each of the intermediate, or interstage, signals /VI, //VI.

The input amplifier stage S1 also includes a shared terminal formed by the mutual connection of the source terminals of transistors M291, M290 and M185. Similarly, intermediate amplifier stage 52 has a shared terminal formed by the mutual connection of the source terminals of transistors M304, M303 and M279, as does the output amplifier stage S3 by the mutual connection of the source terminals of transistors M46, M45 and M267.

Further discussion of an amplifier similar to this can be found in U.S. Pat. No. 6,445,250, a disclosure of which is incorporated herein by reference.

Figure 2:
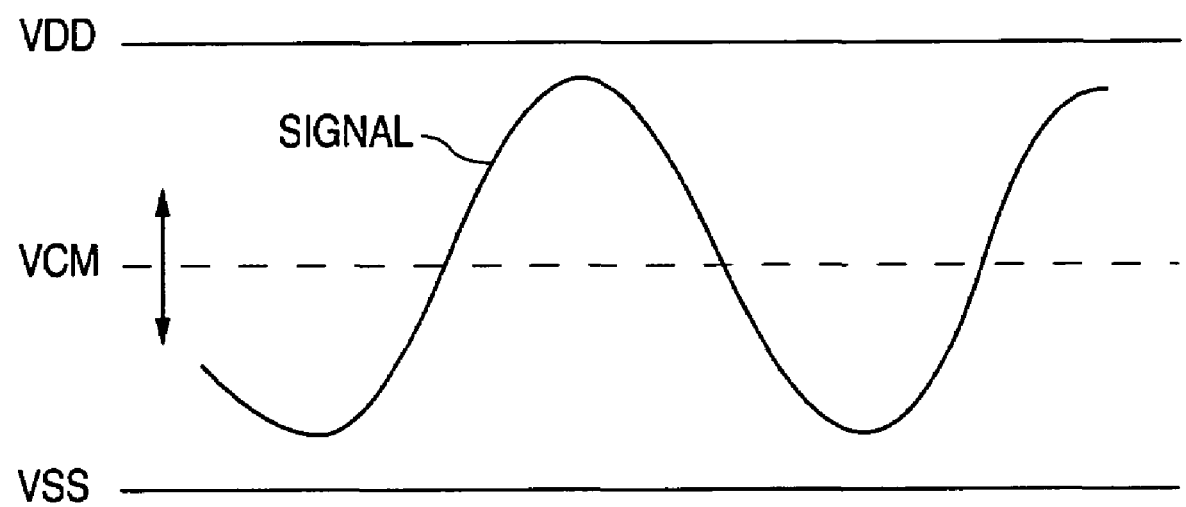
FIG. 2 is a signal diagram depicting the relationship between a common mode voltage and a differential signal.

With reference to FIG. 2, a multistage differential amplifier in accordance with the presently claimed invention allows the common mode voltage VCM of a signal to be controlled for both the input and output signals of the amplifier. In accordance with the presently claimed invention, a single common mode control voltage provides joint control at both the input and output terminals of the amplifier, thereby achieving DC gain and bandwidth substantially equivalent to the gain and bandwidth of the differential signal being amplified.

Figure 3:
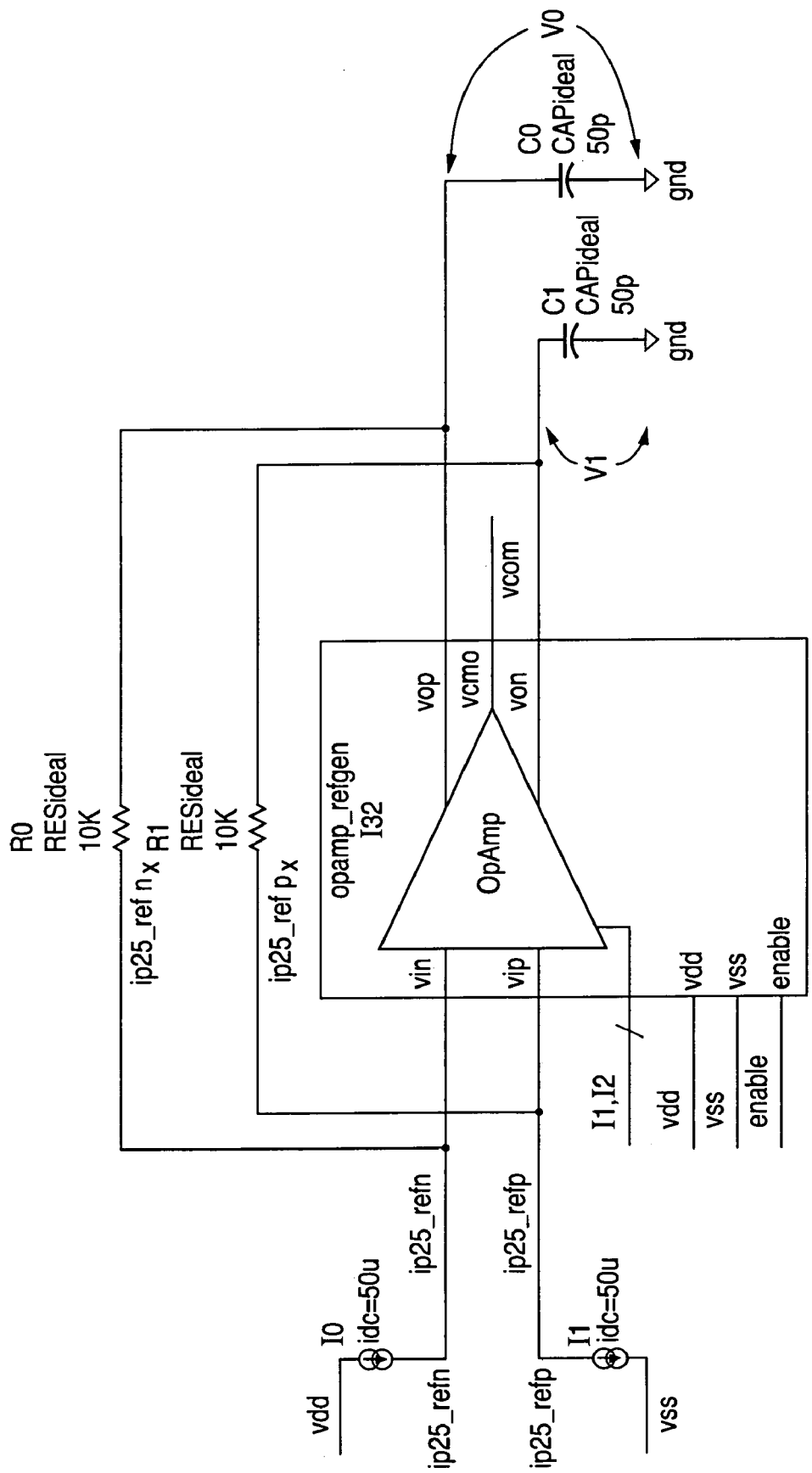
FIG. 3 is a schematic circuit diagram of a transconductance amplifier for which the benefit of commonly controlled input and output common mode voltages can be realized.

Referring to FIG. 3, one application, among others, for which the amplifier circuit of FIGS. 1A and 1B is well suited is that of a transconductance amplifier. Using the amplifier of FIGS. 1A and 1B as the operational amplifier (OP AMP), with feedback resistors RO and RI connected between the signal terminals for the input signal phases VIP, VIN and output terminals for the output signal phases VON, VOP, as shown, reference voltages V0, V1 can be generated across the output capacitors C0, C1 with the application of input currents 10, 11 at the input signal terminals. Ideally, the current sources 10, 11 should be well matched, as should the feedback resistors R0, R1, so as to ensure that the output common mode voltage is equal to the input common mode voltage.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a multistage differential amplifier with commonly controlled input and output common mode voltages, comprising:
    first and second differential input terminals to convey first and second phases of a differential input signal with an associated input common mode voltage;
    first and second differential output terminals to convey first and second phases of a differential output signal corresponding to said differential input signal with an associated output common mode voltage;
    a common mode control terminal to convey a common mode control signal for jointly controlling said input and output common mode voltages; and
    a plurality of differential amplifier circuits successively coupled between said common mode control terminal, said first and second differential input terminals, and said first and second differential output terminals, wherein
    each one of said plurality of differential amplifier circuits includes first and second amplifier input terminals, first and second amplifier output terminals, an input control terminal and an output control terminal,
    a first one of said plurality of differential amplifier circuits is coupled to said first and second differential input terminals via said first and second amplifier input terminals, and is further coupled to said common mode control terminal via said input control terminal,
    a last one of said plurality of differential amplifier circuits is coupled to said first and second differential output terminals via said first and second amplifier output terminals, and
    said first and second amplifier input terminals and said input control terminal of each succeeding one of said plurality of differential amplifier circuits is coupled to said first and second amplifier output terminals and said output control terminal, respectively, of a preceding one of said plurality of differential amplifier circuits.

2. The apparatus of claim 1, wherein each one of said plurality of differential amplifier circuits comprises:
    a first circuit branch including said first amplifier input and output terminals;
    a second circuit branch including said second amplifier input and output terminals; and
    a third circuit branch including said input and output control terminals.

3. The apparatus of claim 2, wherein each one of said plurality of differential amplifier circuits further comprises a shared terminal via which said first, second and third circuit branches are mutually coupled.

4. The apparatus of claim 2, wherein each one said first, second and third circuit branches of at least said first one of said plurality of differential amplifier circuits comprises a plurality of telescopically coupled NMOS transistors..

5. The apparatus of claim 2, wherein each one said first, second and third circuit branches of at least said last one of said plurality of differential amplifier circuits comprises a plurality of telescopically coupled CMOS transistors.

6. An apparatus including a multistage differential amplifier with commonly controlled input and out output common mode voltages, comprising:
    first and second differential input terminals to convey first and second phases of a differential input signal with an associated input common mode voltage;
    first and second differential output terminals to convey first and second phases of a differential output signal corresponding to said differential input signal with an associated output common mode voltage;
    a common mode control terminal to convey a common mode control signal for jointly controlling said input and output common mode voltages;
    a plurality of differential amplifier circuits successively coupled between said common mode control terminal, said first and second differential input terminals, and said first and second differential output terminals, wherein
    each one of said plurality of differential amplifier circuits includes first and second amplifier input terminals first and second amplifier output terminals, an input control terminal and an output control terminal,
    a first one of said plurality of differential amplifier circuits is coupled to said first and second differential input terminals via said first and second amplifier input terminals, and is further coupled to said common mode control terminal via said input control terminal,
    a last one of said plurality of differential amplifier circuits is coupled to said first and second differential output terminals via said first and second amplifier output terminals, and
    said first and second amplifier input terminals and said input control terminal of each succeeding one of said plurality of differential amplifier circuits is coupled to said first and second amplifier output terminals and said output control terminal, respectively, of a preceding one of said plurality of differential amplifier circuits;
    a first biasing circuit coupled to a portion of said plurality of differential amplifier circuits and responsive a first bias current by providing at least a first bias voltage thereto; and
    a second biasing circuit coupled to another portion of said plurality of differential amplifier circuits and responsive to a second bias current by providing at least a second bias voltage thereto.

7. The apparatus of claim 6, wherein said first biasing circuit is further coupled to said common mode control terminal and responsive to said first bias current and said common mode control signal by providing said at least a first bias voltage.

8. An apparatus including a multistage differential amplifier with commonly controlled input and output common mode voltages, comprising:
    input differential amplifier circuitry including
        first and second input amplifier input terminals for reception of first and second phase of a differential input signal with an associated input common mode voltage, first and second input amplifier output terminals,
an input amplifier control input terminal for reception of a common mode control signal, and
an input amplifier control output terminal;
intermediate differential amplifier circuitry including
first and second intermediate amplifier input terminals coupled to said first and second input amplifier output terminals,
first and second intermediate amplifier output terminals,
an intermediate amplifier control input terminal coupled to said input amplifier control output terminal, and
an intermediate amplifier control output terminal; and
output differential amplifier circuitry including
first and second output amplifier input terminals coupled to said first and second intermediate amplifier output terminals,
first and second output amplifier output terminals for conveyance of first and second phases of a differential output signal corresponding to said differential input signal with an associated output common mode voltage corresponding to said input common mode voltage,
an output amplifier control input terminal coupled to said intermediate amplifier control output terminal, and
an output amplifier control output terminal.

9. The apparatus of claim 8, wherein said input differential amplifier circuitry, said intermediate differential amplifier circuitry and said output differential amplifier circuitry each comprises:
first branch circuitry including said first amplifier input and output terminals;
second branch circuitry including said second amplifier input and output terminals; and
third branch circuitry including said input and output control terminals.

10. The apparatus of claim 9, wherein said input differential amplifier circuitry, said intermediate differential amplifier circuitry and said output differential amplifier circuitry each further comprises a shared terminal via which said first branch circuitry, said second branch circuitry and said third branch circuitry am mutually coupled.

11. The apparatus of claim 9, wherein said first branch circuitry, said second branch circuitry and said third branch circuitry of said input differential amplifier circuitry comprises a plurality of telescopically coupled NMOS transistors.

12. The apparatus of claim 11, wherein said first branch circuitry, said second branch circuitry and said third branch circuitry of said intermediate differential amplifier circuitry comprises another plurality of telescopically coupled NMOS transistors.

13. The apparatus of claim 9, wherein said first branch circuitry, said second branch circuitry and said third branch circuitry of said output differential amplifier circuitry comprises a plurality of telescopically coupled CMOS transistors.

14. An apparatus including a multistage differential amplifier with commonly controlled input and output common mode voltages, comprising:
input differential amplifier circuitry including
first and second input amplifier input terminals for reception of first and second phases of u differential input signal with an associated input common mode voltage,
first and second input amplifier output terminals,
an input amplifier control input terminal for reception of a common mode control signal, and
an input amplifier control output terminal;
intermediate differential amplifier circuitry including
first and second intermediate amplifier input terminals coupled to said first and second input amplifier output terminals.
first and second intermediate amplifier output terminals,
an intermediate amplifier control input terminal coupled to said input ampler control output terminal, and
an intermediate amplifier control output terminal:
output differential amplifier circuitry including
first and second output amplifier input terminals coupled to said first and second intermediate amplifier output terminals,
first and second output amplifier output terminals for conveyance of first and second phases of a differential output signal corresponding to said differential input signal with an associated output common mode voltage corresponding to said input common mode voltage,
an output amplifier control input terminal coupled to said intermediate amplifier control output terminal, and
an output amplifier control output terminal;
first biasing circuitry coupled to at least said input differential amplifier circuitry and responsive to a first bias current by providing at least a first bias voltage thereto; and
second biasing circuitry coupled to said output differential amplifier circuitry and responsive to a second bias current by providing at least a second bias voltage thereto.

15. The apparatus of claim 14, wherein said first biasing circuitry is further coupled to said input amplifier control input terminal and responsive to said first bias current and said common mode control signal by providing said at least a lust bias voltage.

16. An apparatus including a multistage differential amplifier with commonly controlled input and output common made voltages, comprising:
input amplifier means for receiving a common mode control signal and an input differential signal with an associated input common mode voltage and in response thereto providing a fast intermediate differential signal and a final intermediate control signal, wherein said input common mode voltage is controlled by said common mode control signal;
intermediate amplifier means for receiving said first intermediate differential signal and said first intermediate: control signal and m response thereto providing a second intermediate differential signal and a second intermediate control signal; and
output amplifier means for receiving said second intermediate differential signal and said second intermediate control signal and in response thereto providing an output differential signal corresponding to said input differential signal with an associated output common mode voltage corresponding to said input common mode voltage.

17. An apparatus including a multistage differential amplifier with commonly controlled input, and output common mode voltages, comprising:

input amplifier means for receiving a common mode control signal and an input differential signal with am associated input common mode voltage and in response thereto providing a first intermediate differential signal and a first intermediate control signal wherein said input common mode voltage is controlled by said common mode control signal;

intermediate amplifier means for receiving said first intermediate differential signal and said first intermediate control signal and in response thereto providing a second intermediate differential signal and a second intermediate control signal;

output amplifier means for receiving said second intermediate differential signal and said second intermediate control signal and in response thereto providing an output differential signal corresponding to said input differential signal with an associated output common mode voltage corresponding to said input common mode voltage;

first biasing means for receiving a first bias current and in response thereto providing at least a first bias voltage for at least said input amplifier means; and second biasing means for receiving a second bias current and in response thereto providing at least a second bias voltage for said output amplifier means.

18. The apparatus of claim 17, wherein said first biasing means is for receiving said first bias current and said common mode control signal and in response thereto providing said at least a first bias voltage.

* * * * *

UNITED STATES PATENT AND TRADEMARK OFFICE
CERTIFICATE OF CORRECTION

PATENT NO.    : 6,982,599 B1
DATED         : January 3, 2006
INVENTOR(S)   : Arlo Aude It is certified that error appears in the above-identified patent and that said Letters Patent is hereby corrected as shown below:

Column 1,
Line 55, delete "made" and insert -- mode --.

Column 3,
Line 54, delete "(N-MOSFETS)" and insert -- (N-MOSFETs) --.
Line 66, delete "1132" and insert -- IB2 --.

Column 4,
Line 23, delete "WEN" and insert -- //VIN --.
Line 38, delete "52" and insert -- S2 --.
Line 61, delete "RO" and insert -- R0 --.
Lines 66 and 67, delete "10, 11" and insert -- I0, I1 --.

Column 6,
Line 8, delete "out".
Line 48, after "responsive" and before "a", insert -- to --.
Line 65, delete "phase" and insert -- phases --.

Column 7,
Line 44, delete "am" and insert -- are --.
Line 65, delete "u" and insert -- a --.

Column 8,
Line 42, delete "lust" and insert -- first --.
Line 45, delete "made" and insert -- mode --.
Line 49, delete "fast" and insert -- first --.
Line 50, delete "final" and insert -- first --.
Line 54, after "intermediate" delete -- : --.
Line 55, delete "m" and insert -- in --.

UNITED STATES PATENT AND TRADEMARK OFFICE
CERTIFICATE OF CORRECTION

PATENT NO. : 6,982,599 B1
DATED : January 3, 2006
INVENTOR(S) : Arlo Aude

It is certified that error appears in the above-identified patent and that said Letters Patent is hereby corrected as shown below:

Column 9,
Line 2, delete "am" and insert -- an --.
Line 5, after "signal", insert -- , --.

Signed and Sealed this

Twenty-first Day of March, 2006

JON W. DUDAS
*Director of the United States Patent and Trademark Office*